United States Patent
Lee et al.

(10) Patent No.: US 7,262,969 B2
(45) Date of Patent: Aug. 28, 2007

(54) HEAT SINK CLIP ASSEMBLY

(75) Inventors: Hsieh-Kun Lee, Tu-Cheng (TW); Cui-Jun Lu, Shenzhen (CN); Yong-Dong Chen, Shenzhen (CN)

(73) Assignees: Fu Zhun Precision Industry (Shenzhen) Co., Ltd., Bao'an District, Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 248 days.

(21) Appl. No.: 11/012,422

(22) Filed: Dec. 14, 2004

(65) Prior Publication Data

US 2006/0007659 A1 Jan. 12, 2006

(30) Foreign Application Priority Data

Jul. 6, 2004 (CN) .................. 2004 2 0071417

(51) Int. Cl.
 *H05K 7/20* (2006.01)
 *F28F 7/00* (2006.01)
 *H01L 23/24* (2006.01)

(52) U.S. Cl. .............. 361/704; 257/718; 257/719; 165/80.3; 165/185; 361/710; 361/719

(58) Field of Classification Search ........ 257/718–719; 361/719

See application file for complete search history.

(56) References Cited

U.S. PATENT DOCUMENTS

| 6,307,748 | B1 * | 10/2001 | Lin et al. ............. 361/704 |
| 6,545,879 | B1 * | 4/2003 | Goodwin ............. 361/807 |
| 6,611,431 | B1 * | 8/2003 | Lee et al. ............. 361/719 |
| 6,859,367 | B2 * | 2/2005 | Davison ............. 361/704 |
| 2004/0047130 | A1 | 3/2004 | Liu |

* cited by examiner

*Primary Examiner*—Gregory Thompson
(74) *Attorney, Agent, or Firm*—Morris Manning Martin LLP; Tim Tingkang Xia, Esq.

(57) ABSTRACT

A heat sink clip assembly is for attaching a heat sink (10) to a motherboard (60). The motherboard and the heat sink each respectively define through apertures (52) and through holes (16) therein. The heat sink clip assembly includes four sleeves (46), four posts (38), four fasteners (41), and four spring members (44). Each sleeve comprises a top section and a bottom section. The top sections of the sleeves engage in the through holes respectively to attach the sleeves to the heat sink. The posts extend through the through apertures and received in the bottom sections of the sleeves. Each fastener includes a top head and a bottom end, the bottom ends extend into the sleeves and coupled to the top portions of the posts. The spring members are compressed between the top heads of the fasteners and the heat sink urging the heat sink toward the motherboard.

23 Claims, 3 Drawing Sheets

HEAT SINK CLIP ASSEMBLY

BACKGROUND OF THE INVENTION

1. Field of the Invention

The present invention relates to means for securing heat sinks in apparatus such as computers, and particularly to a clip assembly for attaching a heat sink to a computer electronic package.

2. Related Art

Developments in integrated circuits have resulted in greater circuit density and complexity, thus increasing heat generated by operation of such integrated circuits within an electronic package. Heat sinks are often attached on the electronic packages to efficiently remove the heat.

Nowadays, a resilient clip is popularly used to attach a heat sink on an electronic package such as a central processing unit (CPU). The clip engages with a socket of the CPU. However, the CPU bears an entire weight of the heat sink. If a large, heavy heat sink is employed, it is difficult for the assembly to pass a standard vibration test. Furthermore, when a large heat sink is attached to the CPU, it is difficult to ensure that the retaining forces applied by the clip are uniform. If the retaining forces are not uniform, the heat sink is unlikely to have uniform thermal contact with the corresponding surface of the CPU. In such case, the efficiency of heat dissipation is reduced.

Another means for attaching a heat sink on a CPU comprises four through holes defined in four corners of the heat sink, and four threaded holes defined in a motherboard. Screws are extended through the through holes of the heat sink and engaged in the threaded holes of the motherboard, thereby attaching the heat sink to the CPU. However, the heat sink is rigidly connected to the CPU. It is difficult to ensure that the heat sink applies uniform pressure on the CPU, thus tending to reduce the efficiency of heat dissipation. Furthermore, the rigid connection is prone to deform the motherboard.

Therefore, an improved means for securing a heat sink which overcomes the above-mentioned problems is desired.

BRIEF SUMMARY OF THE INVENTION

Accordingly, an object of the present invention is to provide a heat sink clip assembly for readily attaching a heat sink to an electronic package such as a CPU.

To achieve the above-mentioned object, a heat sink clip assembly in accordance with a preferred embodiment of the present invention attaches a heat sink to a CPU that is mounted on a motherboard. The motherboard and the heat sink each respectively define through apertures and through holes therein. The heat sink clip assembly includes four sleeves, four posts, four fasteners, and four spring members. Each sleeve comprises a top section and a bottom section. The top sections of the sleeves engage in the through holes respectively to attach the sleeves to the heat sink. The posts extend through the through apertures and received in the bottom sections of the sleeves. Each fastener includes a top head and a bottom end, the bottom ends extend into the sleeves and coupled to the top portions of the posts. The spring members are compressed between the top heads of the fasteners and the heat sink urging the heat sink toward the motherboard.

Other objects, advantages and novel features of the present invention will be drawn from the following detailed description of the preferred embodiment of the present invention with the attached drawings, in which:

DESCRIPTION OF THE PREFERRED EMBODIMENT

Figure 1:
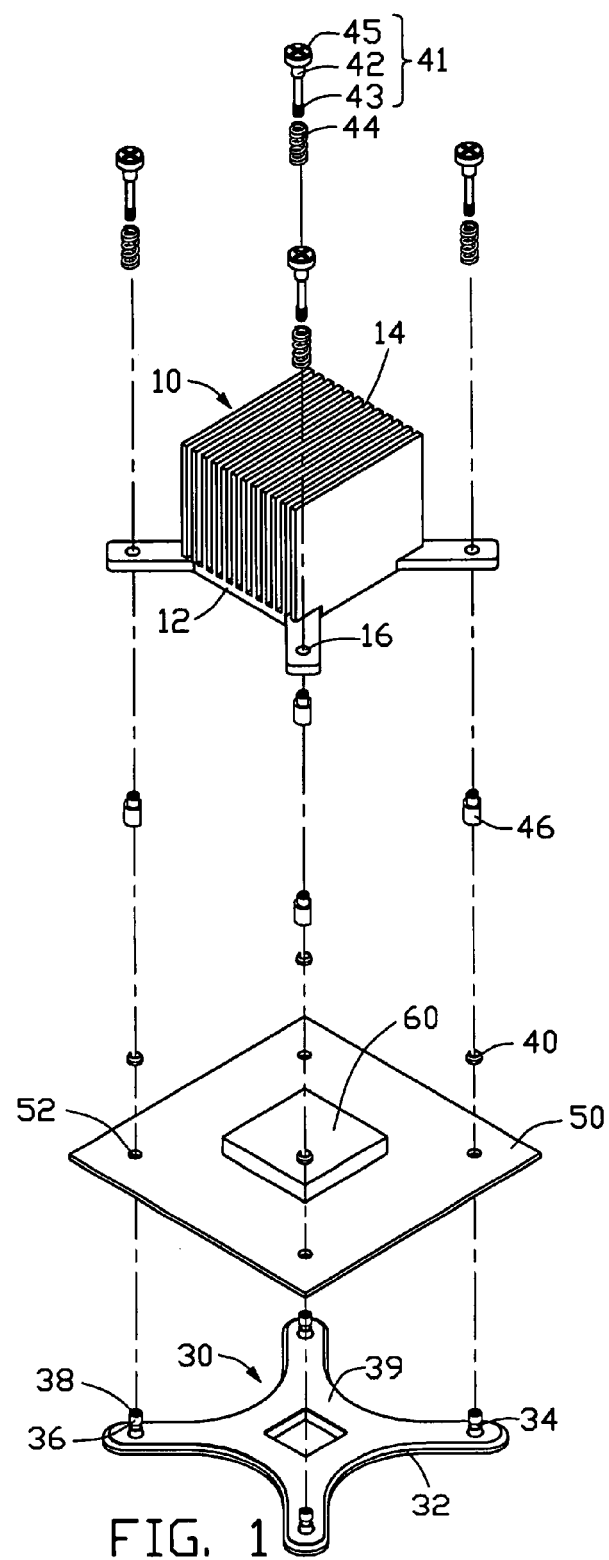
FIG. 1 is an exploded isometric view of a heat sink clip assembly in accordance with a preferred embodiment of the present invention, together with a heat sink, and a CPU mounted on a motherboard.

Referring to FIG. 1, a heat sink clip assembly in accordance with the present invention is used to attach a heat sink 10 to a CPU 60 that is mounted on a motherboard 50.

The motherboard 50 defines therein four through apertures 52 surrounding the CPU 60. The heat sink 10 comprises a base 12, and a plurality of parallel fins 14 extending upwardly from the base 12. Four through holes 16 are defined in four corners of the base 12, corresponding to the through apertures 52 of the motherboard 50.

The heat sink clip assembly comprises a back plate 30, four fasteners 41, and four sleeves 46. The back plate 30 comprises a main body 32, and four posts 36 extending upwardly from corners of the main body 32. Each post 36 comprises an annular groove 34 defined in a middle portion thereof, and an engaging end 38 at a top portion thereof. An internal threaded hole (not labeled) is defined in the engaging end 38. Four plastic rings 40 are for respective engagement in the annular grooves 34 of the posts 36, preventing the back plate 30 from being pulled away the motherboard 50. Each plastic ring 40 is tapered, and has a break (not labeled) to provide resilient deformation. The back plate 30 also comprises an electrically insulative shock absorber 39 on a face thereof that contacts the motherboard 50, preventing the motherboard 50 from being damaged by the shock of the back plate 30.

Each fastener 41 comprises a generally cylindrical shank portion 42 having a top head 45 and a bottom threaded end 43, and a spring member such as a coil spring 44 disposed around the shank portion 42. The threaded end 43 of the fastener 41 is for engagement in the internal threaded hole of a corresponding post 36. A diameter of the head 45 is greater than a diameter of the coil spring 44, and a diameter of the coil spring 44 is greater than a diameter of a corresponding through hole 16 of the heat sink 10, so that the coil spring 44 is compressible between the head 45 of the fastener 41 and the base 12 of the heat sink 10. A diameter of the shank portion 42 is less than a diameter of the threaded end 43, so that the shank portion 42 can readily pass through the through hole 16 of the heat sink 10.

Figure 2:
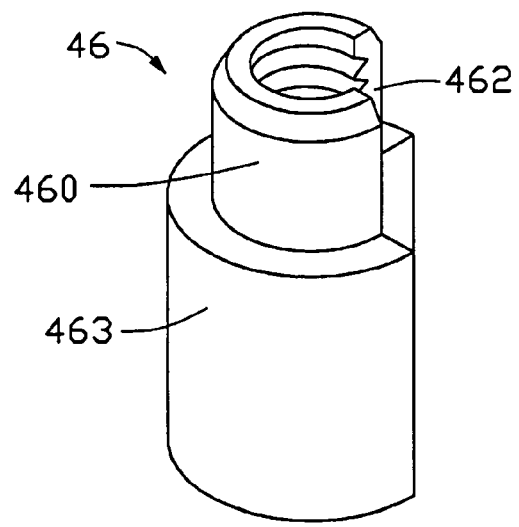
FIG. 2 is an isometric view of the sleeve of the assembly of FIG. 1.

Referring also to FIG. 2, each sleeve 46 is generally cylindrical, and comprises a hollow top section 460 and a hollow bottom section 463. A break 462 radially and axially extending through the wall portion of the top and bottom sections 460, 463. This break 462 provides the sleeve 46 with an amount of resiliency. An external diameter of the bottom section 463 is greater than an external diameter of the top section 460. An external diameter of the top section 460 is greater than a diameter of the through hole 16. The top section 460 serves as a connecting portion to be engaged in the through hole 16 for joint of the sleeve 46 and the heat sink 10. The top section 460 defines an internal threaded hole therein, corresponding to the threaded end 43 of the fastener 41.

Figure 3:
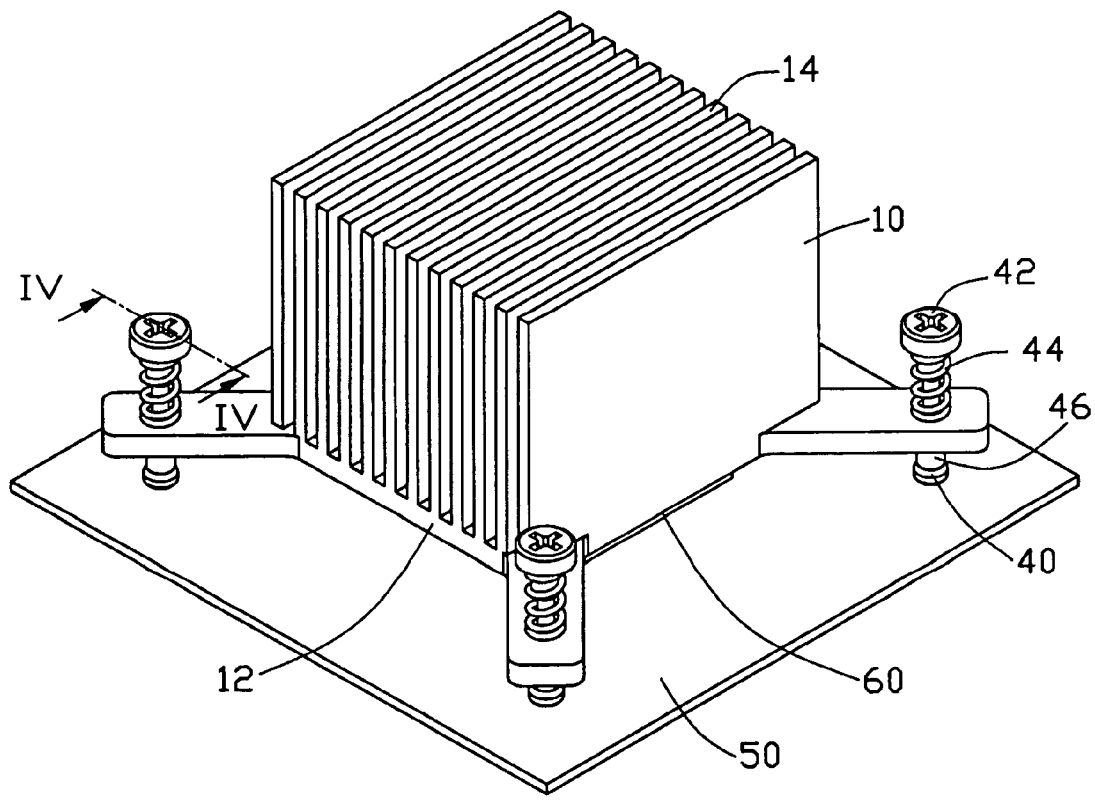
FIG. 3 is an assembled view of the assembly of FIG. 1.
Figure 4:
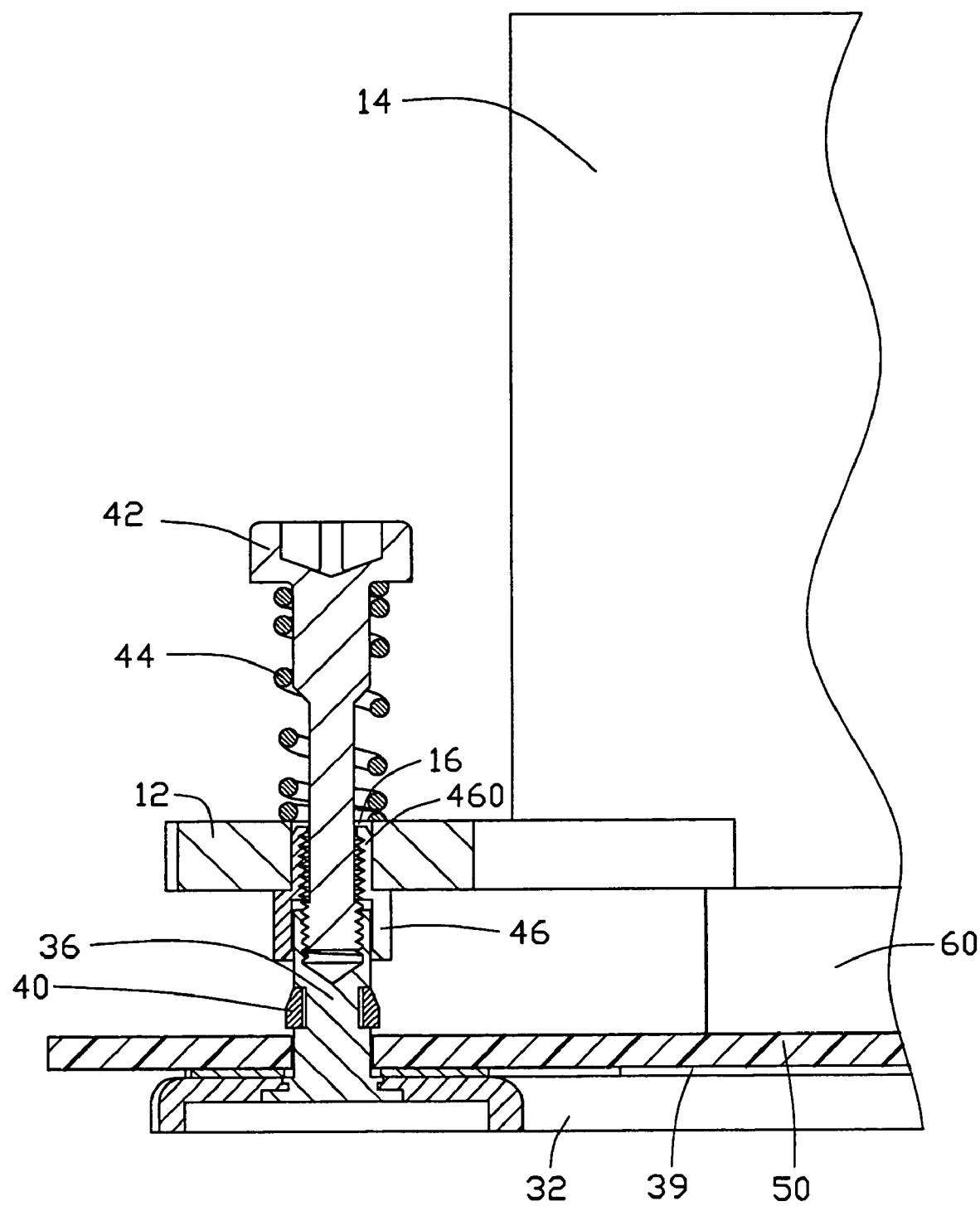
FIG. 4 is a cross sectional view of the assembly of FIG. 3, taken along line IV-IV thereof.

Referring also to FIGS. 3 and 4, in pre-assembly, the sleeves 46 are depressed to enable the top sections 460 of the sleeves 46 to interferentially engage in the through holes 16 of the heat sink 10 receptively, so that the sleeves 46 are secured to the heat sink 10. Alternatively, the sleeves 46 can be secured to the heat sink 10 by other means, such as by soldering. The threaded ends 43 pass through the coil springs 44, and engage in the internal threaded holes of the top sections 460. Therefore, the fasteners 41 and the sleeves 46 are pre-assembled to the heat sink 10.

The plastic rings 40 are received in the annular grooves 34 of the posts 36 of the back plate 30. The motherboard 50 is placed on the back plate 30, and the posts 36 are pressed through the through apertures 52 of the motherboard 50. The plastic rings 40 are thereby elastically compressed so that they pass through the through apertures 52. The back plate 30 is thus pre-assembled to the motherboard 50. The plastic rings 40 deformably and firmly retain the back plate 30 on the motherboard 50. Alternatively, the plastic rings 40 can be received in the annular grooves 34 of the posts 36 after the annular grooves 34 are exposed above the top surface of the motherboard 50.

The combination of the heat sink 10, the fasteners 41 and the sleeves 46 is then placed on the CPU 60 that is on the motherboard 50. The engaging ends 38 of the posts 36 are received in the bottom sections 463 of the sleeves 46 with the internal threaded holes of the posts 36 precisely aligning with the internal threaded holes of the top sections 460 of the sleeves 46, respectively. The fasteners 41 are depressed and rotated, so that the threaded ends 43 of the fasteners 41 respectively engage in the internal threaded holes of the posts 36. The coil springs 44 are compressed between the base 12 of the heat sink 10 and the heads 45 of the fasteners 41, and therefore exert resilient forces on the heat sink 10 toward the motherboard 50. The heat sink 10 is thus secured on the motherboard 50.

In the present invention, the engagement of each fastener 41 with its corresponding post 36 can be adjusted, so that the coil springs 44 cooperatively apply even clamping forces to the heat sink 10. In addition, before fastening the fasteners 41, bottom sections 463 of the sleeves 46 receive the engaging ends 38 of the posts 36 therein to guide and pre-position the heat sink 10 in place, with the internal threaded holes of the posts 36 precisely aligning with the internal threaded holes of the top sections 460. This makes the fastening operation of the fasteners 41 into the internal threaded holes of the posts 36 relatively easier.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink clip assembly comprising:
   a printed circuit board with thereon an electronic package assembly and therein a plurality of through apertures surrounding the electronic package assembly;
   a heat sink seated upon the electronic package assembly defining a plurality of through holes in alignment with the through apertures respectively;
   a plurality of sleeves attached to the heat sink, each of the sleeves comprising a top section and a bottom section, the top sections engaging in the through holes respectively;
   a plurality of posts extending through the through apertures of the printed circuit board and received in the bottom sections of the sleeves respectively;
   a plurality of fasteners each comprising a top head and a bottom end, the bottom ends extending into the sleeves and coupled to top portions of the posts respectively; and
   a plurality of spring members respectively abutting the top heads of the fasteners and downwardly urging the heat sink toward the printed circuit board.

2. The heat sink clip assembly as described in claim 1, further comprising a back plate attached to an underside of the printed circuit board, wherein the posts extend upwardly from the back plate.

3. The heat sink clip assembly as described in claim 2, wherein the back plate comprises a shock absorber sandwiched between the printed circuit board and the back plate for preventing the printed circuit board from being damaged by the shock of the back plate.

4. The heat sink clip assembly as described in claim 1, wherein each of the fasteners comprises threads formed on the bottom end thereof, each of the posts defines therein an internal threaded hole at the top portion thereof, and the threaded end of the fastener engages in the threaded hole of the post to position the heat sink on the printed circuit board.

5. The heat sink clip assembly as described in claim 4, wherein each of the top sections of the sleeves defines an internal threaded hole for engagingly receiving the threaded end of a corresponding fastener therein to pre-assemble the fastener to the heat sink.

6. The heat sink clip assembly as described in claim 1, wherein the spring members are coil springs respectively surrounding the fasteners and being compressed between the top heads of the fasteners and the heat sink.

7. The heat sink clip assembly as described in claim 2, wherein each of the posts defines an annular groove in the middle thereof, a deformable ring is received in the groove and is deformably seated on a top face of the printed circuit board for pre-assembling the back plate on the printed circuit board.

8. The heat sink clip assembly as described in claim 7, wherein the ring is tapered, and has a break to provide elastic deformation.

9. The heat sink clip assembly as described in claim 1, wherein each of the sleeves defines a break in the wall portion thereof, the break radially and axially extending through the top and bottom sections to provide the sleeve with an amount of resiliency.

10. The heat sink clip assembly as described in claim 1, wherein an external diameter of the top section of each sleeve is greater than a diameter of each through hole of the heat sink, so that the each sleeve can interferentially engage in each through hole.

11. A heat sink clip assembly comprising:
    a printed circuit board with thereon an electronic package assembly and therein a plurality of through apertures surrounding the electronic package assembly;
    a heat sink seated upon the electronic package assembly and defining a plurality of through holes in alignment with the through apertures respectively;
    a back plate located below the printed circuit board;
    a plurality of posts upwardly extending from the back plate and through the through apertures respectively, each of the posts comprising a top engaging end defining therein an internal threaded hole;

a plurality of sleeves attached below the heat sink with the through holes aligning with inner holes of the sleeves respectively, the sleeves receiving the engaging ends therein respectively;

a plurality of fasteners each comprising a top head and a bottom threaded end, the threaded ends extending through the through holes and engaging in the internal threaded holes, respectively; and a plurality of spring members respectively compressed between the top heads and the heat sink so as to exert resilient forces on the heat sink toward the printed circuit board;

wherein each of the sleeves comprises a top section and a bottom section, the top section engages in a corresponding through hole, and the bottom section recieves the engaging end of a corresponding post therein.

12. The heat sink clip assembly as described in claim 11, wherein each of the sleeves defines a break in the wall portion thereof, the break radially and axially extending through the top and bottom sections to provide the sleeve with an amount of resiliency.

13. The heat sink clip assembly as described in claim 11, each of the top sections defines an internal threaded hole for engagingly receiving the threaded end of a corresponding fastener therein to pre-assemble the fastener to the heat sink.

14. A method of assembling a heat sink onto an electronic package that is mounted on a printed circuit board, the heat sink and the printed circuit board defining aligned through holes and through apertures respectively, the heat sink comprising a plurality of hollow members attached below the heat sink and aligned with the through holes respectively, the method comprising the steps of:

providing a plurality of posts each comprising an engaging end;

extending the engaging ends of the posts through the through apertures of the printed circuit board respectively;

mounting the heat sink on the electronic package with the engaging ends of the posts received in the hollow members respectively; and extending a plurality of fasteners through the through holes of the heat sink to engage with the engaging ends respectively;

wherein each of the hollow members comprises a top section engaging in a corresponding through hole, and a bottom section receiving the engaging end of a corresponding post therein.

15. The method as described in claim 14, wherein each of the fasteners comprises a bottom threaded end, each of the engaging ends defines therein an internal threaded hole, and the threaded ends engage in the internal threaded holes respectively.

16. The method as described in claim 14, wherein each of the hollow members defines a break in the wall portion thereof, the break radially and axially extending through the top and bottom sections to provide the sleeve with an amount of resiliency.

17. The method as described in claim 14, wherein each of the fasteners comprises a bottom threaded end, each of the top sections defines an internal threaded hole for retainingly receiving the bottom threaded end of a corresponding fastener therein before the heat sink is mounted to the electronic package.

18. The method as described in claim 14, wherein each of the fasteners comprises a spring member downwardly urging the heat sink toward the printed circuit board.

19. A heat sink assembly comprising:

a heat sink used to thermally contact with an electronic package assembly and dissipate heat from said electronic package assembly to ambient air around said heat sink;

at least one fastener attachable to said heat sink and approachable to said electronic package assembly together with said heat sink, and fixable to a corresponding post arranged around said electronic package assembly so as to establish a securely thermal contact of said heat sink with said electronic package assembly; and a sleeve corresponding to said at least one fastener and attached thereto, and having a guide section to substantially confine relative positions of said at least one fastener and said corresponding post before said at least one fastener reaches said corresponding post so as to facilitate fixation between said at least one fastener and said corresponding post;

wherein said guide section of said sleeve partially receives said corresponding post therein and confines movement of said corresponding post relative to said sleeve before said at least one fastener moves to reach said corresponding post and fix thereto.

20. The heat sink assembly as described in claim 19, wherein said corresponding post is formed on a back plate located at a side of said electronic package assembly opposing to said heat sink.

21. The heat sink assembly as described in claim 19, wherein the sleeve comprises a first portion, a second portion, and a step formed between the first portion and the second portion, at least one of the first portion and the second portion engages in the heat sink, and the step limits insertion of the sleeve into the heat sink.

22. The heat sink assembly as described in claim 21, wherein the at least one fastener is capable of engaging with the first portion of the sleeve to pre-assemble the at least one fastener to the heat sink before the at least one fastener extends into to the second portion of the sleeve to engage with the corresponding post.

23. The heat sink assembly as described in claim 22, wherein the guide section comprises a hole defines in the second portion of the sleeve.

* * * * *